United States Patent
Hird et al.

(10) Patent No.: US 12,345,134 B2
(45) Date of Patent: Jul. 1, 2025

(54) DEVICES, SYSTEMS, AND METHODS FOR DOWNHOLE POWER GENERATION

(71) Applicant: Schlumberger Technology Corporation, Sugar Land, TX (US)

(72) Inventors: Jonathan Robert Hird, Cambridge (GB); Andrew David Robinson, Cambridge (GB)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 18/464,878

(22) Filed: Sep. 11, 2023

(65) Prior Publication Data

US 2024/0084674 A1 Mar. 14, 2024

Related U.S. Application Data

(60) Provisional application No. 63/375,266, filed on Sep. 12, 2022.

(51) Int. Cl.
*E21B 41/00* (2006.01)
*H02N 2/18* (2006.01)

(52) U.S. Cl.
CPC ......... *E21B 41/0085* (2013.01); *H02N 2/188* (2013.01)

(58) Field of Classification Search
CPC ............................ E21B 41/0085; H02N 2/188
See application file for complete search history.

(56) References Cited

U.S. PATENT DOCUMENTS

| | | | | |
|---|---|---|---|---|
| 4,387,318 A | * | 6/1983 | Kolm | F03D 5/00 310/330 |
| 4,467,236 A | * | 8/1984 | Kolm | H10N 30/308 310/329 |
| 6,069,845 A | * | 5/2000 | Ambs | B06B 1/0633 310/369 |
| 2008/0048455 A1 | * | 2/2008 | Carney | F03D 5/00 290/54 |
| 2008/0277941 A1 | * | 11/2008 | Bowles | H02N 2/185 310/339 |
| 2009/0140604 A1 | * | 6/2009 | Chen | E21B 41/0085 310/311 |
| 2020/0076288 A1 | * | 3/2020 | Nerubenko | F16F 7/1005 |

OTHER PUBLICATIONS

Safaei et al., A review of energy harvesting using piezoelectric materials: state-of-the-art a decade later (2008-2018), Smart Maetrials and Structures, 28, 2019, 62 pages.

Liu et al., A comprehensive review on piezoelectric energy harvesting technology: Materials, mechanisms, and applications, Applied Physics Reviews. 5(4) 041306 https://doi.org/10.1063/1.5074184, Dec. 27, 2018, 26 pages.

(Continued)

*Primary Examiner* — Sean Gugger

(57) ABSTRACT

A downhole energy harvesting system includes a housing subjected to periodic oscillations. An energy harvesting device is on, in, or otherwise connected to the housing and positioned to generate electricity based on the periodic oscillations. The energy harvesting device is coupled to at least one of a powered component or an energy storage device in order to use or store the harvested energy.

12 Claims, 9 Drawing Sheets

(56) References Cited

OTHER PUBLICATIONS

Gunn et al., "Energy Harvesting From Torsional Vibrations Using a Nonlinear Oscillator." Proceedings of the ASME 2016 International Design Engineering Technical Conferences and Computers and Information in Engineering Conference. vol. 8: 28th Conference on Mechanical Vibration and Noise. Charlotte, North Carolina, USA. Aug. 21-24, 2016, 9 pages.

Piezo, Piezo Energy Harvester Components, Products, downloaded from Piezo.com, https://piezo.com/collections/piezoelectric-energy-harvesters _= pf pf_t_quantity=Quantity_1, 2023, 15 pages.

8 Power, Vibration energy harvesting, downloaded from https://www.8power.com/ 3 pages.

DuraAct Patch Transducet Technology by Physik Instrumente, downloaded from https://www.pi-usa.us/en/apps-tech/technology/piezo-technology/duraact-patch-transducer-technology/, 2023, 7 pages.

Covaci et al., Piezoelectric Energy Harvesting Solutions: A Review, Sensors 2020, 20(12), 3512; 37 pages.

Analog Devices's LTC3588-1, downloaded from https://www.analog.com/en/products/ltc3588-1.html#product-overview, 2023, 10 pages.

\* cited by examiner

DEVICES, SYSTEMS, AND METHODS FOR DOWNHOLE POWER GENERATION

CROSS-REFERENCE TO RELATED APPLICATIONS

The subject disclosure claims priority from U.S. Provisional Appl. No. 63/375,266, filed on Sep. 12, 2022, herein incorporated by reference in its entirety.

BACKGROUND

Drilling systems are often used to access reservoirs of hydrocarbons and other subsurface resources. Modern drilling systems may include one or more electronic systems. The electronic systems use electric power. Power may be provided in a number of ways. For example, power may be provided by a battery or downhole turbine.

SUMMARY

In some embodiments, the techniques described herein relate to a downhole energy harvesting system. The downhole energy harvesting system includes a housing subjected to periodic oscillations. An energy harvesting device is connected to the housing and positioned to generate electricity based on the periodic oscillations. An energy storage device is connected to the energy harvesting device.

In some embodiments, the techniques described herein relate to a downhole energy harvesting system. The downhole energy harvesting system includes an energy harvesting device configured to be connected to a housing of a downhole tool. The energy harvesting device generates an alternating current (AC) based on periodic oscillations of the housing. An electric signal processor is connected to the energy harvesting device, the electric signal processor being configured to convert the AC current to DC current. An energy storage device is connected to electric signal processor.

In some embodiments, the techniques described herein relate to a method for downhole energy generation. Periodic oscillations are received at an energy harvesting device located on a housing. Based on the periodic oscillations, the energy harvesting device generates electricity. The electricity is stored on an energy storage device located on the housing.

This summary is provided to introduce a selection of concepts that are further described in the detailed description. This summary is not intended to identify key or essential features of the claimed subject matter, nor is it intended to be used as an aid in limiting the scope of the claimed subject matter. Additional features and aspects of embodiments of the disclosure will be set forth herein, and in part will be obvious from the description, or may be learned by the practice of such embodiments.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 2-1 and FIG. 2-2 are side and top views, respectively, of a downhole energy harvesting system, according to at least one embodiment of the present disclosure;

DETAILED DESCRIPTION

This disclosure generally relates to devices, systems, and methods for generating power in a downhole environment by harnessing the energy from periodic torsional oscillations and/or vibrations. A downhole tool may include an energy harvesting device. The energy harvesting device may move based on the torsional oscillations and/or vibrations. The movement of the energy harvesting device may generate electricity. For example, the energy harvesting device may include a piezoelectric material. As the energy harvesting device moves, the piezoelectric material may generate electricity, which may be captured and stored for use in the downhole tool. In this manner, the energy harvesting system may generate electricity using the periodic oscillations and/or vibrations present in a downhole drilling system. In at least one embodiment, the amount of generated electricity is greater than 1 mW/hr.

Figure 1:
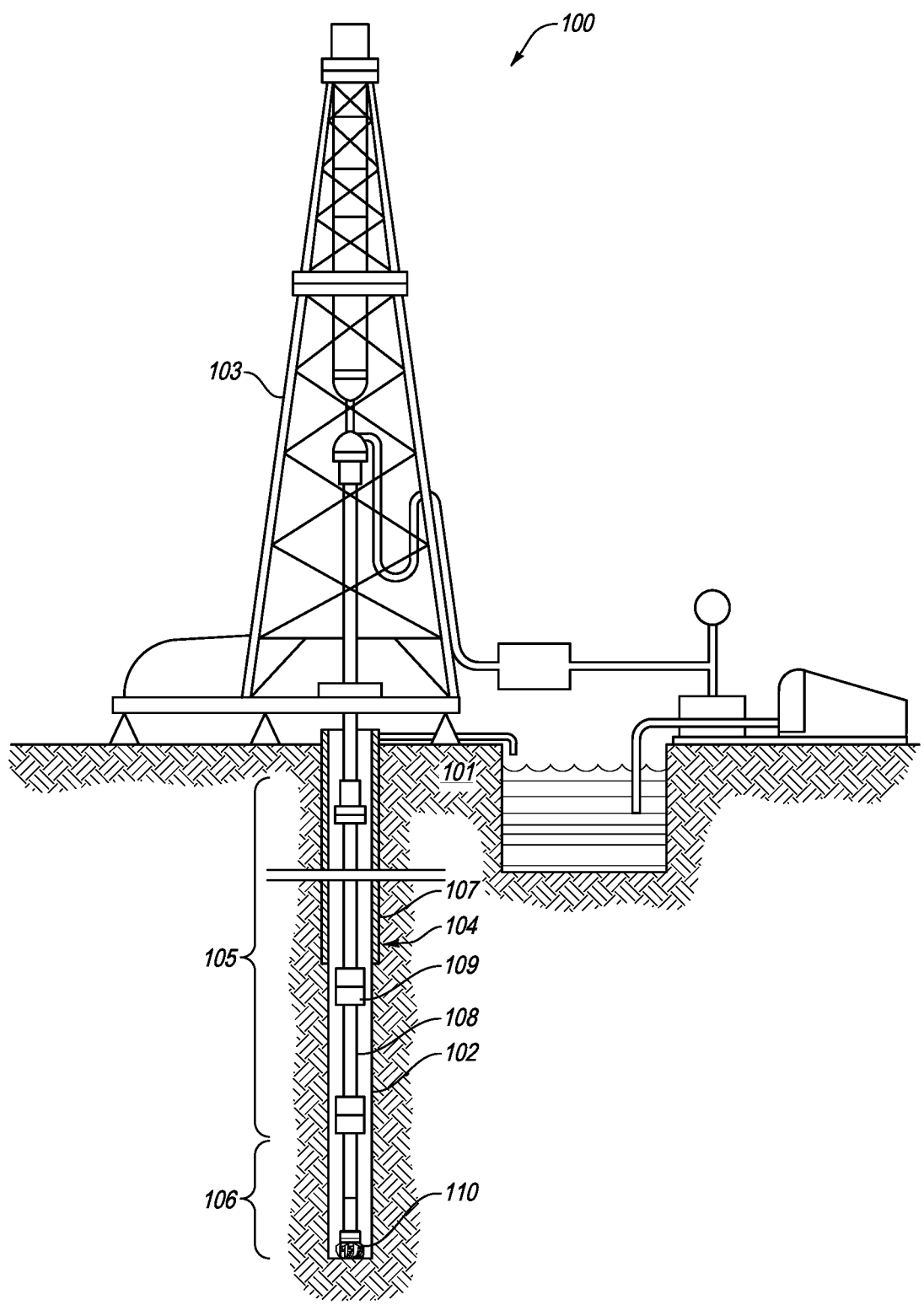
FIG. 1 is a schematic illustration of a drilling system for drilling an earth formation to form a wellbore, according to at least one embodiment of the present disclosure.

FIG. 1 shows one example of a drilling system 100 for drilling an earth formation 101 to form a wellbore 102. The drilling system 100 includes a drill rig 103 used to turn a drilling tool assembly 104 which extends downward into the wellbore 102. The drilling tool assembly 104 may include a drill string 105, a bottomhole assembly ("BHA") 106, and a bit 110, attached to the downhole end of drill string 105.

The drill string 105 may include several joints of drill pipe 108 connected end-to-end through tool joints 109. The drill string 105 transmits drilling fluid through a central bore and transmits rotational power from the drill rig 103 to the BHA 106. In some embodiments, the drill string 105 may further include additional components such as subs, pup joints, etc. The drill pipe 108 provides a hydraulic passage through which drilling fluid is pumped from the surface. The drilling fluid discharges through selected-size nozzles, jets, or other orifices in the bit 110 for the purposes of cooling the bit 110 and cutting structures thereon, and for lifting cuttings out of the wellbore 102 as it is being drilled.

The BHA 106 may include the bit 110 or other components. An example BHA 106 may include additional or other components (e.g., coupled between/to the drill string 105 and the bit 110). Examples of additional BHA components include drill collars, stabilizers, measurement-while-drilling ("MWD") tools, logging-while-drilling ("LWD") tools, downhole motors, underreamers, section mills, hydraulic disconnects, jars, vibration or dampening tools, other components, or combinations of the foregoing. The BHA 106 may further include a rotary steerable system ("RSS"). The RSS may include directional drilling tools that change a direction of the bit 110, and thereby the trajectory of the wellbore. At least a portion of the RSS may maintain a geostationary position relative to an absolute reference frame, such as gravity, magnetic north, true north, or combinations thereof. Using measurements obtained with the geostationary position, the RSS may locate the bit 110, change the course of the bit 110, and direct the directional drilling tools on a projected trajectory.

In general, the drilling system 100 may include other drilling components and accessories, such as special valves (e.g., kelly cocks, blowout preventers, and safety valves). Additional components included in the drilling system 100 may be considered a part of the drilling tool assembly 104, the drill string 105, or a part of the BHA 106 depending on their locations in the drilling system 100.

The BHA 106 may include a downhole energy harvesting system. During operation, the drill string 105 and the BHA 106 may experience periodic oscillations. For example, the drill string 105 and the BHA 106 may vibrate based on rotation of the bit 110, the drill string 105, contact with the earth formation 101 by the drill string 105 and/or the BHA 106, degradation of the earth formation 101 by the bit 110, vibration from equipment at the surface, fluid flow through the drill string 105 and/or the BHA 106, any other forces, and combinations thereof. Such periodic oscillations may be torsional oscillations, or changes in the torque applied to the drill string 105 and/or the BHA 106. The changes in torque may include changes in torque direction. In some embodiments, the periodic oscillations may include axial vibrations transverse or perpendicular to an axis of rotation of the drill string 105 and/or the BHA 106. In some embodiments, the periodic oscillations may include longitudinal vibrations, or vibrations parallel to the axis of rotation of the drill string 105 and/or the BHA 106.

The downhole energy harvesting system may be connected to or installed on a housing subjected to periodic oscillations. The periodic oscillations may be generated on the housing as a consequence of creating a borehole. The downhole energy harvesting system may use the periodic oscillations to generate electricity downhole. The electricity may be used to power one or more elements of the BHA 106. For example, the electricity generated by the downhole energy harvesting system may be used to power a sensor of the BHA, such as a survey sensor, a location sensor, a directional sensor, any other sensor, and combinations thereof.

The downhole energy harvesting system may use an energy harvesting device to harvest energy from the periodic oscillations. The energy harvesting device may include any type of energy harvesting device. For example, the energy harvesting device may include a vibrating mass. The vibrating mass may vibrate based on the periodic oscillations to generate electricity. For example, the vibrating mass may include a piezoelectric material. Flexure of the vibrating mass may cause the piezoelectric material to generate an electric current. In some examples, the energy harvesting device may include a piezoelectric sheet. The piezoelectric sheet may be connected to a housing subjected to periodic oscillations. For example, the piezoelectric sheet may be connected to an outer surface of the housing of the BHA 106, and flexure in the housing of the BHA 106 may cause the piezoelectric material in the piezoelectric sheet to flex, thereby creating an electric charge.

In some embodiments, the downhole energy harvesting system may directly power one or more electronic devices. In some embodiments, the downhole energy harvesting system may include one or more energy storage devices. The electric charge may be used to charge the energy storage devices. In some embodiments, the energy storage device charged by the energy harvesting device may include a battery, a supercapacitor, any other energy storage device, and combinations thereof.

The bit 110 in the BHA 106 may be any type of bit suitable for degrading downhole materials. For instance, the bit 110 may be a drill bit suitable for drilling the earth formation 101. Example types of drill bits used for drilling earth formations are fixed-cutter or drag bits. In other embodiments, the bit 110 may be a mill used for removing metal, composite, elastomer, other materials downhole, or combinations thereof. For instance, the bit 110 may be used with a whipstock to mill into casing 107 lining the wellbore 102. The bit 110 may also be a junk mill used to mill away tools, plugs, cement, other materials within the wellbore 102, or combinations thereof. Swarf or other cuttings formed by use of a mill may be lifted to surface, or may be allowed to fall downhole.

Figures 1, 2:
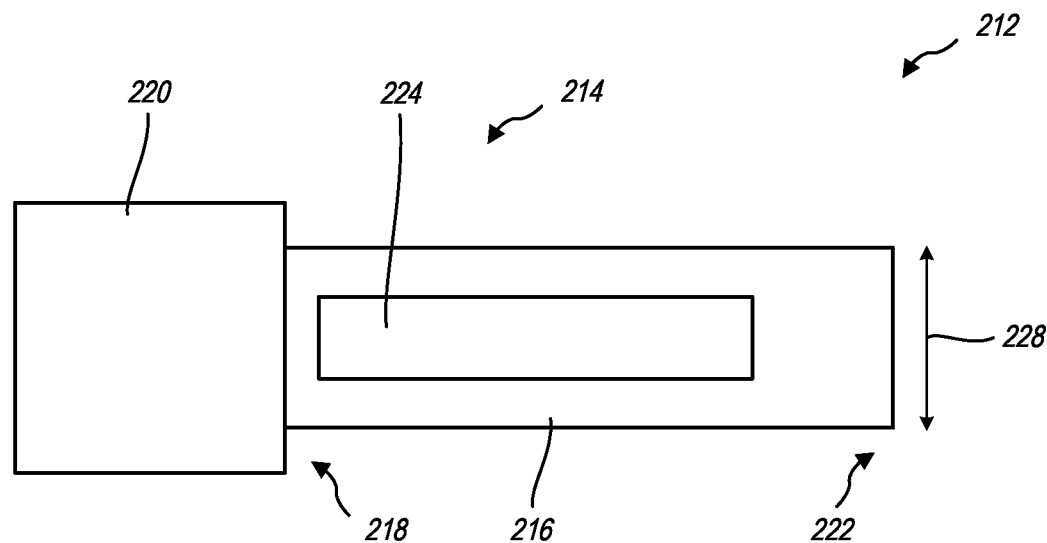
Figure 2:
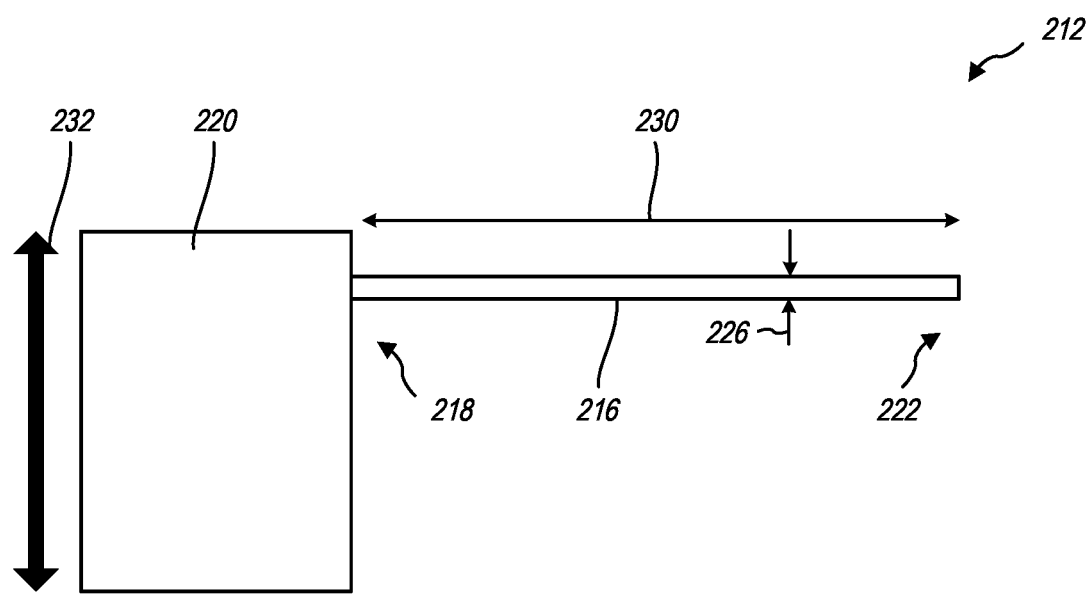

FIG. 2-1 is a representation of a downhole energy harvesting system 212 for use in a downhole drilling system, according to at least one embodiment of the present disclosure. The downhole energy harvesting system 212 may include an energy harvesting device 214. The energy harvesting device 214 may use periodic oscillations to generate electricity. The downhole energy harvesting system 212 may be located on a downhole tool, such as a BHA, MWD, LWD, drilling mechanism module (DMM), any other downhole tool, and combinations thereof.

In the embodiment shown, the energy harvesting device 214 includes a cantilevered body 216. The cantilevered body 216 may be secured or clamped at a first end 218 to a clamp 220. A second end 222 of the cantilevered body 216 may be free and/or unsupported. As discussed herein, the downhole energy harvesting system 212 may be located in the housing of a downhole tool, sub, drill pipe, other downhole element, or combinations thereof. For example, the clamp 220 may be secured to the housing. The housing may be subjected to periodic oscillations. The cantilevered body 216 may be secured to the clamp 220 at the first end 218. As the clamp 220 oscillates, the cantilevered body 216 may begin vibrating from the first end 218. The cantilevered body 216 may continue to vibrate or oscillate toward the second end 222. Put another way, as the housing experiences periodic oscillations, the energy harvesting device 214 may oscillate with the housing.

The cantilevered body 216 may include a piezoelectric strip 224 along a length thereof. As the downhole energy harvesting system 212 oscillates based on the periodic oscillation, the cantilevered body 216 may flex. The flexure of the cantilevered body 216 may cause the piezoelectric strip 224 to change shape. Changing shape of the piezoelectric strip 224 may cause the piezoelectric strip 224 to generate an electric current.

In the embodiment shown, the piezoelectric strip 224 is a strip of piezoelectric material connected to the cantilevered body 216. The piezoelectric strip 224 may be located at any location along the cantilevered body 216. For example, the piezoelectric strip 224 may be located at or near a location of maximum strain on the cantilevered body 216, such as a point of inflection of the cantilevered body 216. In some examples, the piezoelectric strip 224 may extend along an entirety of a body length 230 of the cantilevered body 216. In some embodiments, the piezoelectric strip 224 may be embedded within the body of the cantilevered body 216. In some embodiments, an entirety of the cantilevered body 216 may be formed from a piezoelectric material.

The piezoelectric strip 224 may generate current having a positive charge when the cantilevered body 216 flexes in a first direction. The piezoelectric strip 224 may generate current having a negative charge when the cantilevered body 216 flexes in a second direction. In this manner, the piezoelectric strip 224 may generate alternating current (AC).

FIG. 2-2 is a cross-sectional view of the downhole energy harvesting system 212 of FIG. 2-1. In the embodiment shown, the cantilevered body 216 has a planar body, with a body thickness 226 that is much less than a body width 228 or a body length 230. This may allow the cantilevered body 216 to flex in the direction of the body thickness 226. For example, the cantilevered body 216 shown may flex upward and downward in the view shown in FIG. 2-2.

In accordance with at least one embodiment of the present disclosure, the downhole energy harvesting system 212 and the cantilevered body 216 may be oriented so that the cantilevered body 216 flexes in a direction parallel to the periodic oscillations. For example, the periodic oscillations may have an oscillation direction 232. In some embodiments, the oscillation direction 232 is the primary direction of the largest oscillation magnitude of the oscillations. As the downhole tool oscillates, vibrates, experiences other movements, or combinations thereof, the downhole tool may have an oscillation amplitude, which may be the distance from a neutral location that the vibrations may travel. Orienting the downhole energy harvesting system 212 and the cantilevered body 216 to maximize the oscillation magnitude may help to maximize the flexure of the cantilevered body 216, which may increase the electric current generated by the piezoelectric strip 224, in at least one embodiment.

In some embodiments, as the downhole tool oscillates, vibrates, experiences other movements, or combinations thereof, the downhole tool may have various tool resonant frequencies oriented in various oscillation directions 232. In some embodiments, the downhole energy harvesting system 212 and the cantilevered body 216 may be oriented parallel to an oscillation direction 232 having a particular tool resonant frequency. For example, the cantilevered body 216 may have a body resonant frequency. The downhole energy harvesting system 212 and the cantilevered body 216 may be oriented parallel to an oscillation direction 232 that has a tool resonant frequency that is the same as or approximately the same as the body resonant frequency. This may help to increase the efficiency of the electricity generation by the downhole energy harvesting system 212.

Figure 3:
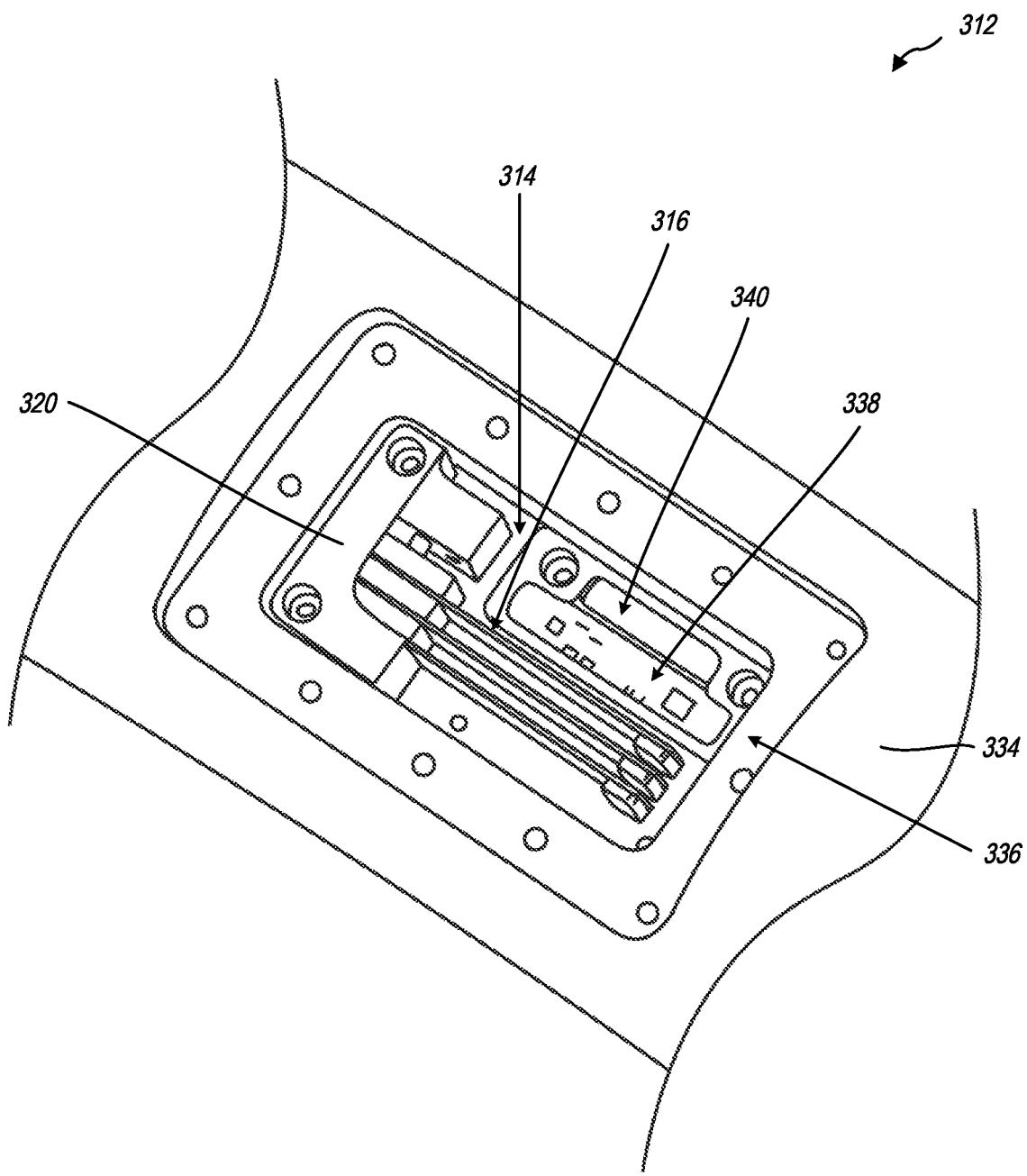
FIG. 3 is a perspective view of an energy harvesting system located in a housing, according to at least one embodiment of the present disclosure.

FIG. 3 is a representation of a downhole energy harvesting system 312 located in a housing 334 subjected to periodic oscillations, according to at least one embodiment of the present disclosure. The downhole energy harvesting system 312 includes an energy harvesting device 314 located in a pocket 336 of the housing 334. The pocket 336 may be a cavity or a void located in an outer surface of the housing 334. The energy harvesting device 314 may be placed in the pocket 336. A cover or plate may be placed over the pocket 336 to keep drilling fluid, cuttings, mud, other elements, or combinations thereof out of the pocket 336 and away from the energy harvesting device 314.

The energy harvesting device 314 may include a cantilevered body 316 secured to a clamp 320. The clamp 320 may be secured to the pocket 336 of the housing 334. As the housing 334 experiences periodic oscillations, the clamp 320 may oscillate and/or vibrate with it. The connected cantilevered body 316 may vibrate and/or oscillate with the oscillations of the housing 334.

The cantilevered body 316 may include piezoelectric material, such as a piezoelectric strip connected to an outer surface of the cantilevered body 316 or other piezoelectric material. As the cantilevered body 316 flexes during the periodic oscillations, the piezoelectric material may generate an electric current. The piezoelectric material may be connected, such as through one or more conducting wires, to an electric signal processor 338. The electric signal processor 338 may receive the current (e.g., AC current) generated by the cantilevered body 316 and/or distribute the power to various electric systems in the downhole tool.

In some embodiments, the electric signal processor 338 may include an AC to direct current ("DC") power converter. The power converter in the electric signal processor 338 may convert the AC current into DC current. The DC current may be usable by one or more sensors and/or other electric systems in the downhole tool. In some embodiments, the electric signal processor 338 may direct the DC current to an energy storage device 340. The energy storage device 340 may include any type of energy storage device, such as a battery and/or a supercapacitor. Energy stored in the energy storage device 340 may be stored for later use by the electrical systems of the downhole tool. The electric signal processor 338 may distribute the power stored in the energy storage device 340 to the electrical systems on an as-needed and available basis. In this manner, the power generated by the cantilevered body 316 may be used at any time, and not just at the time the power is generated, in at least one embodiment.

In the embodiment shown, the energy harvesting device 314 includes a plurality of energy harvesting devices 314. Specifically, the embodiment shown includes three cantilevered bodies 316. The cantilevered bodies 316 are shown as being oriented parallel to each other. Orienting multiple cantilevered bodies 316 may help to increase the amount of electricity generated. Because the cantilevered bodies 316 are oriented parallel to each other, additional cantilevered bodies 316 may not occupy much additional room, thereby increasing the amount of energy generated. In some embodiments, different cantilevered bodies 316 may be oriented in different directions. In this manner, the energy harvesting device 314 may generate energy based on periodic oscillations oriented in multiple directions. While three cantilevered bodies 316 are shown in FIG. 3, it should be understood that any number of cantilevered bodies 316 may be used, including 1, 2, 3, 4, 5, 6, 7, 8, 9, 10, or more cantilevered bodies 316. In some embodiments, all of the plurality of cantilevered bodies 316 may be oriented in the same direction. In some embodiments, a first set (including 1 or more cantilevered bodies 316) of the cantilevered bodies 316 may be oriented in a first direction, and a second set (including 1 or more cantilevered bodies 316) of the cantilevered bodies 316 may be oriented in a second different direction.

In the embodiment shown in FIG. 3, the energy harvesting device 314 is located in the pocket 336 in an outer surface of the housing 334. This may improve the ease of access to the energy harvesting device 314 for maintenance, replacement, other access, or combinations thereof. In some embodiments, the energy harvesting device 314 may be located in any location on a downhole tool. For example, the energy harvesting device 314 may be located in a pocket located on an inner surface of the housing 334. In some embodiments, the energy harvesting device 314 may be located in a sub-housing connected to the housing. In some embodiments, the energy harvesting device 314 may be connected to the outer surface or the inner surface of the housing 334.

Figure 4:
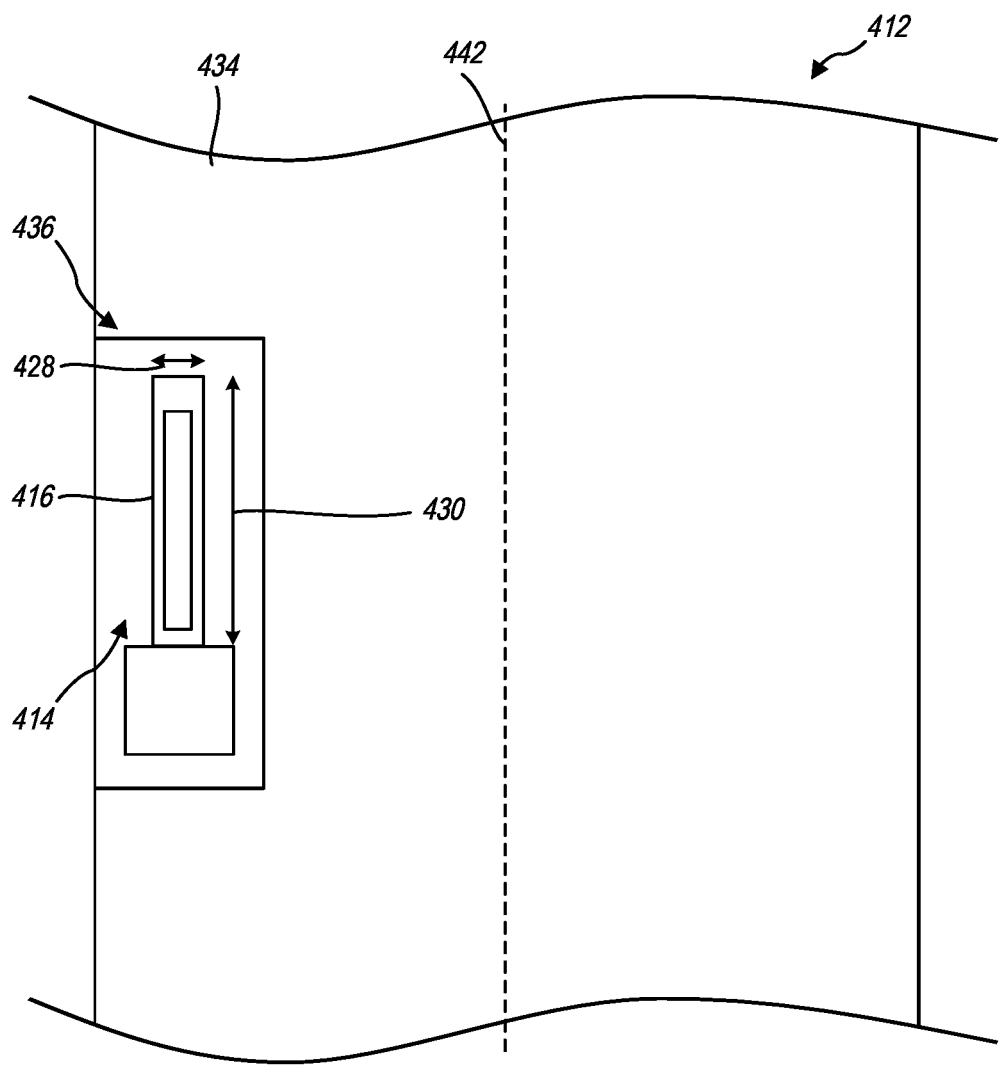
FIG. 4 is a side view of a downhole energy harvesting system, according to at least one embodiment of the present disclosure.

FIG. 4 is a representation of a longitudinal cross-sectional view of a downhole energy harvesting system 412, according to at least one embodiment of the present disclosure. The downhole energy harvesting system 412 includes a housing 434 subjected to periodic oscillations. The downhole energy harvesting system 412 may include an energy harvesting device 414 located in a pocket 436 of the housing 434. The housing 434 may rotate around a rotational axis 442. As discussed herein, during operation, the housing 434 may experience torsional oscillations. A torsional oscillation may be rotational movement and/or torque in the housing 434 that is about the rotational axis 442.

The energy harvesting device 414 may include a cantilevered body 416 that is oriented and/or otherwise arranged to vibrate or flex based on torsional oscillations. The energy harvesting device 414 may be oriented with a vibrating plane of the cantilevered body 416 oriented parallel or approximately parallel to the rotational axis 442. The vibrating plane may be the plane along which the cantilevered body 416 vibrates. For example, in the embodiment shown, the vibrating plane of the cantilevered body 416 is the plane that is parallel to the body width 428 and the body length 430. In some embodiments, the vibrating plane may intersect the rotational axis 442. In this manner, regardless of the rotational position of the cantilevered body 416, the cantilevered body 416 may vibrate based on rotational oscillations of the housing 434.

In some embodiments, the vibrating plane of the cantilevered body 416 may be oriented in any other direction. For example, the vibrating plane of the cantilevered body 416 may be oriented to capture axial vibrations. Axial vibrations may be vibrations that are oriented transverse or perpendicular to the rotational axis 442. To collect energy from the axial vibrations, the vibrating plane of the cantilevered body 416 may be parallel to the rotational axis 442 and transverse or perpendicular to a line extending perpendicular to the rotational axis 442.

Figure 5:
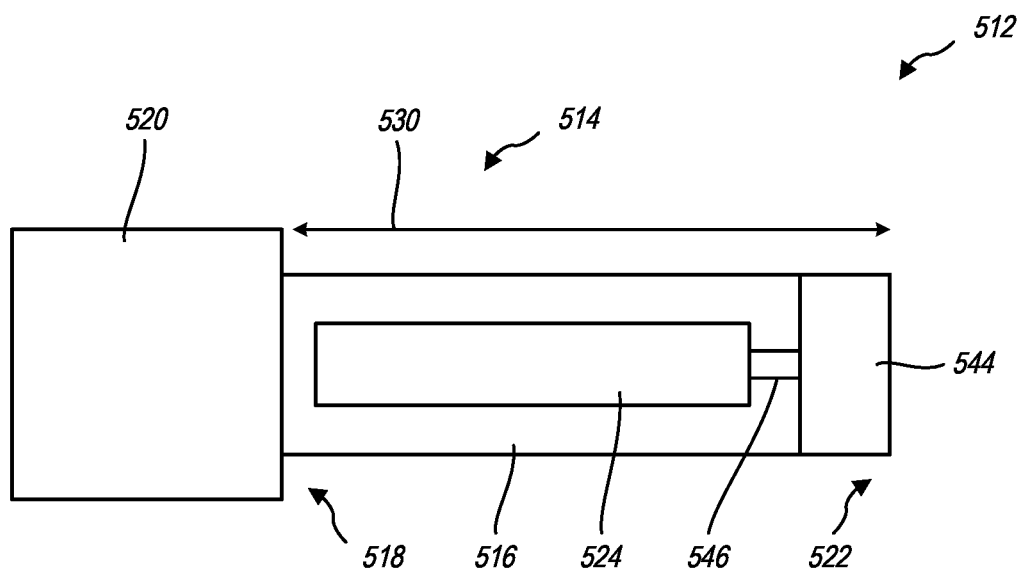
FIG. 5 is a side of a downhole energy harvesting system having a tuning mass, according to at least one embodiment of the present disclosure.

FIG. 5 is a representation of a downhole energy harvesting system 512 having a tuning mass 544, according to at least one embodiment of the present disclosure. The downhole energy harvesting system 512 shown includes an energy harvesting device 514 having a cantilevered body 516 connected to a clamp 520 at a first end 518 of the cantilevered body 516. The cantilevered body 516 is free or unbounded at a second end 522 of the cantilevered body 516. A piezoelectric strip 524 may be connected to or located on the cantilevered body 516. The energy harvesting device 514 may experience periodic oscillations and/or vibrations. This may cause the cantilevered body 516 to flex, thereby causing the piezoelectric strip 524 to flex and generate an electric current.

The cantilevered body 516 may have a resonant frequency. The periodical oscillations may have harmonic frequencies associated with peaks in the displacement magnitude. In some embodiments, matching or approximately matching the resonant frequency of the cantilevered body 516 to the harmonic frequencies of the housing may increase the power generated and/or the efficiency of power generation by the downhole energy harvesting system 512.

In some embodiments, the resonant frequency of the cantilevered body 516 may be based on the properties of the cantilevered body 516, including the length, width, thickness, mass, material type, any other property of the cantilevered body 516, and combinations thereof. In some embodiments, the harmonic frequency of the periodic oscillations of the housing may be constant during operation. The cantilevered body 516 may be sized with a resonant frequency that matches the harmonic frequency of the housing.

In accordance with at least one embodiment of the present disclosure, the resonant frequency of the cantilevered body 516 may be adjustable. Adjusting the resonant frequency of the cantilevered body 516 may allow the downhole energy harvesting system 512 to generate more electricity based on the harmonic frequency of the housing.

The cantilevered body 516 may include a tuning mass 544 located at the second end 522. The size and/or location of the tuning mass 544 may adjust the resonant frequency of the cantilevered body 516. In some embodiments, the size and/or location of the tuning mass 544 on the cantilevered body 516 may be determined prior to installation of the downhole energy harvesting system 512 in the housing. This may allow the energy harvesting device 514 to be adjustable based on a particular housing or downhole tool. In accordance with at least one embodiment of the present disclosure, resonant frequency of the cantilevered body 516 may be adjusted during operation of the downhole tool.

In some embodiments, to adjust the resonant frequency of the cantilevered body 516, the tuning mass 544 may be movable along a body length 530 of the cantilevered body 516. For example, the tuning mass 544 may be located along a track 546 on the cantilevered body 516 relative to which it may move. The track 546 may extend along all or a portion of the body length 530 of the cantilevered body 516. To adjust the resonant frequency of the cantilevered body 516, the tuning mass 544 may be moved along the length of the body length 530 using the track 546.

In some embodiments, the tuning mass 544 may be movable along the track 546 during operation of the downhole tool. For example, the tuning mass 544 may be connected to a linear motor or other mechanism to adjust the position of the tuning mass 544 along the body length 530. During operation, one or more tool sensors may determine the harmonic frequency of the downhole tool. The resonant frequency may be adjusted based on known or predetermined positions of the tuning mass 544. During operation, a controller, such as the electric signal processor, may adjust the position of the tuning mass 544 to one of the predetermined positions to adjust the resonant frequency of the cantilevered body 516 to match or approximately match the harmonic frequency of the housing.

Figure 6:
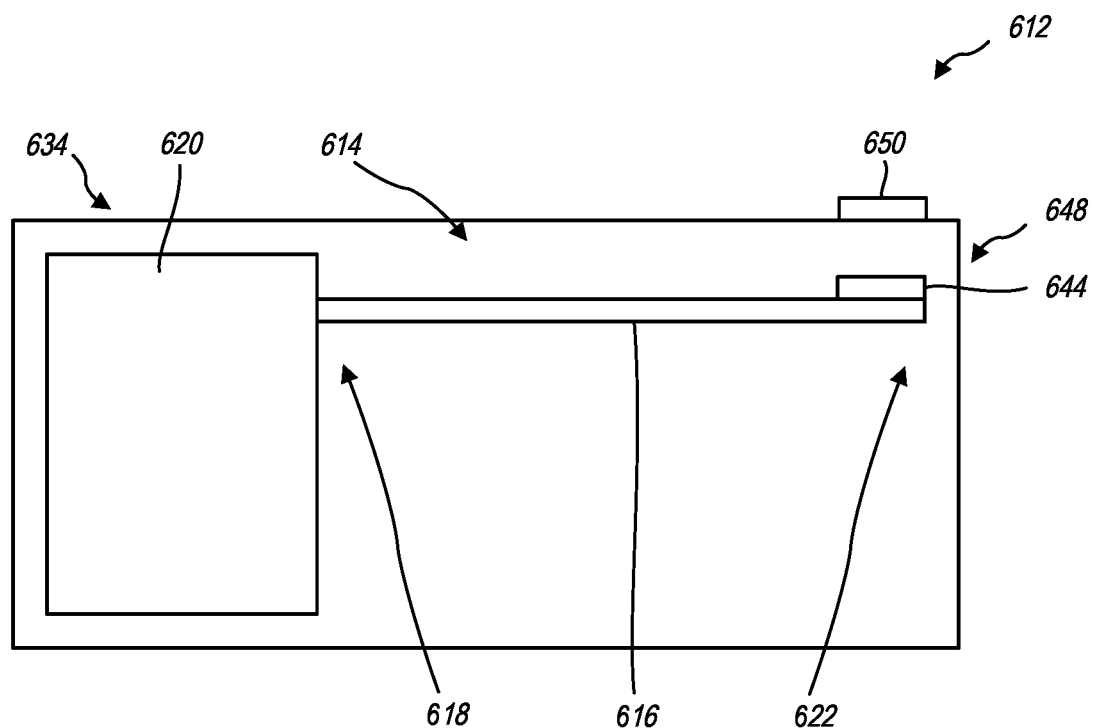
FIG. 6 is a top view of a downhole energy harvesting system including a magnetic tuner, according to at least one embodiment of the present disclosure.

FIG. 6 is a representation of a downhole energy harvesting system 612 including a magnetic tuner 648, according to at least one embodiment of the present disclosure. The downhole energy harvesting system 612 shown includes an energy harvesting device 614. The energy harvesting device 614 may include a cantilevered body 616 connected to a clamp 620 at a first end 618 of the cantilevered body 616. The magnetic tuner 648 may be located at a second end 622 of the cantilevered body 616.

The magnetic tuner 648 may include a tuning mass 644 that is formed from a magnetic material. The magnetic tuner 648 may further include a magnet 650. The magnet 650 may emit a magnetic field that may interact with the magnetic tuning mass 644. The strength of the magnetic field may change the force of the magnet 650 on the tuning mass 644. The force of the magnetic field on the tuning mass 644 may adjust the resonant frequency of the cantilevered body 616. In this manner, by adjusting the magnet 650 to have different magnetic strength fields, the resonant frequency of the cantilevered body 616 may be adjusted. In some embodiments, the distance between the magnet 650 and the tuning mass 644 may adjust the strength of the magnetic field applied to the tuning mass 644 and the resonant frequency of the cantilevered body 616.

In some embodiments, the magnet 650 is an electromagnet having an adjustable magnetic field. In this manner, the resonant frequency of the cantilevered body 616 may be adjusted by adjusting the magnetic field of the magnet 650. In some embodiments, the magnetic field of the magnet 650 may be adjusted during operation. For example, during operation of the downhole tool, the magnetic field of the magnet 650 may be adjusted by varying the amount of electricity that is applied to the magnet 650.

The magnet 650 may be located in a housing 634. In some embodiments, the magnet 650 may be embedded in the housing 634. In some embodiments, the magnet 650 may be connected to an outer surface of the housing 634.

Figure 7:
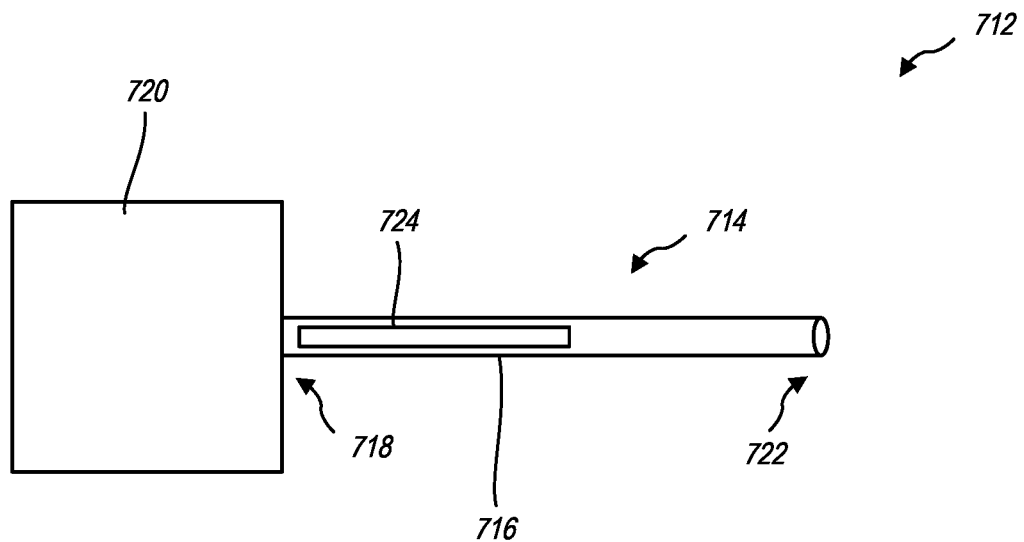
FIG. 7 is a side view of a downhole energy harvesting system, according to at least one embodiment of the present disclosure.

FIG. 7 is a representation of a downhole energy harvesting system 712, according to at least one embodiment of the present disclosure. The downhole energy harvesting system 712 shown includes an energy harvesting device 714 having a cantilevered body 716 connected to a clamp 720 at a first end 718 of the cantilevered body 716. The cantilevered body 716 is free or unbounded at a second end 722 of the cantilevered body 716. A piezoelectric component (e.g., piezoelectric strip 724) may be connected to or located on the cantilevered body 716. The energy harvesting device 714 may experience periodic oscillations and/or vibrations. This may cause the cantilevered body 716 to flex, thereby causing the piezoelectric strip 724 to flex and generate an electric current.

In the embodiment shown, the cantilevered body 716 has a cylindrical shape. This may allow the cantilevered body 716 to vibrate or oscillate in any direction. In this manner, the cantilevered body 716 may generate electricity from any type of periodic oscillations that are oriented in any direction.

As discussed herein, the piezoelectric strip 724 may be located on an outer surface of the cantilevered body 716 and/or embedded in the body of the cantilevered body 716. In some embodiments, the piezoelectric strip 724 may include piezoelectric crystals or material that is oriented to generate energy based on any directional vibration of the cantilevered body 716. In some embodiments, the cantilevered body 716 may be formed entirely of the piezoelectric material.

While the cantilevered body 716 shown in FIG. 7 is cylindrical, it should be understood that the cantilevered body may be formed from any shape. For example, as may be seen in FIG. 2-1 and FIG. 2-2, the cantilevered body may be formed from a rectangular prism. In some embodiments, the cantilevered body may be formed from any 3-dimensional shape, including pyramidal, triangular prismatic, rectangular prismatic, pentagonal prismatic, hexagonal prismatic, prismatic of any shape, cymbals, rods, discs, any other 3-dimensional shape, and combinations thereof.

Figure 8:
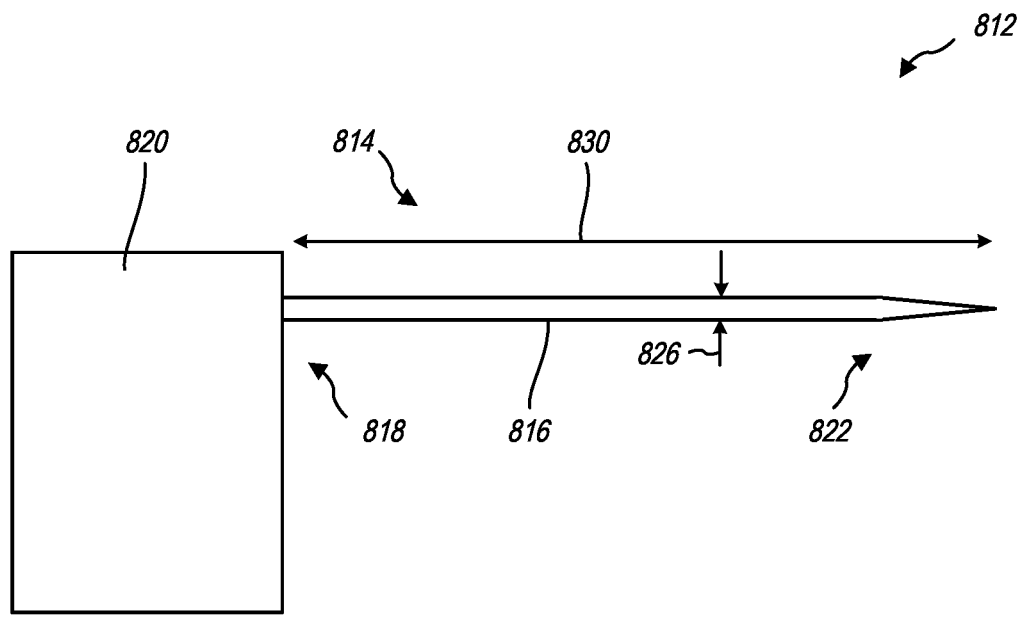
FIG. 8 is a side view of a downhole energy harvesting system, according to at least one embodiment of the present disclosure.

FIG. 8 is a representation of a downhole energy harvesting system 812, according to at least one embodiment of the present disclosure. The downhole energy harvesting system 812 shown includes an energy harvesting device 814 having a cantilevered body 816 connected to a clamp 820 at a first end 818 of the cantilevered body 816. The cantilevered body 816 is free or unbounded at a second end 822 of the cantilevered body 816. A piezoelectric strip may be connected to or located on the cantilevered body 816. The energy harvesting device 814 may experience periodic oscillations and/or vibrations. This may cause the cantilevered body 816 to flex, thereby causing the piezoelectric strip to flex and generate an electric current.

The cantilevered body 816 has a body thickness 826 and a body length 830. In accordance with at least one embodiment of the present disclosure, the body thickness 826 is not constant along the body length 830. For example, the body thickness 826 may decrease between the first end 818 and the second end 822. The body thickness 826 may be related to the deflection of the cantilevered body 816 during vibration or oscillation. In some embodiments, the deflection of the cantilevered body 816 may be larger where the body thickness 826, and the associated mass of the cantilevered body 816, is smaller. In some embodiments, a larger deflection of the cantilevered body 816 may be associated with a larger flexure of the cantilevered body 816. More flexure of the cantilevered body 816 may result in the piezoelectric material generating more electricity.

In some embodiments, the body thickness 826 may be at a minimum at the second end 822. This may increase the deflection of the cantilevered body 816 at the second end. In some embodiments, this may help to increase the electricity generation of the downhole energy harvesting system 812. In some embodiments, the body thickness 826 of the cantilevered body 816 may be at a minimum at any point between the first end 818 and the second end 822.

In some embodiments, the cantilevered body 816 may decrease in body thickness 826 linearly between the first end 818 and the second end 822. In some embodiments, the cantilevered body 816 may decrease in thickness in any type of pattern between the first end 818 and the second end 822, including a polynomial pattern, an exponential pattern, a hyperbolic pattern, any other pattern, and combinations thereof. In some embodiments, the cantilevered body 816 may decrease in body thickness 826 starting at the clamp 820. In some embodiments, the cantilevered body 816 may start decreasing in body thickness 826 at any point between the first end 818 and the second end 822.

Figure 9:
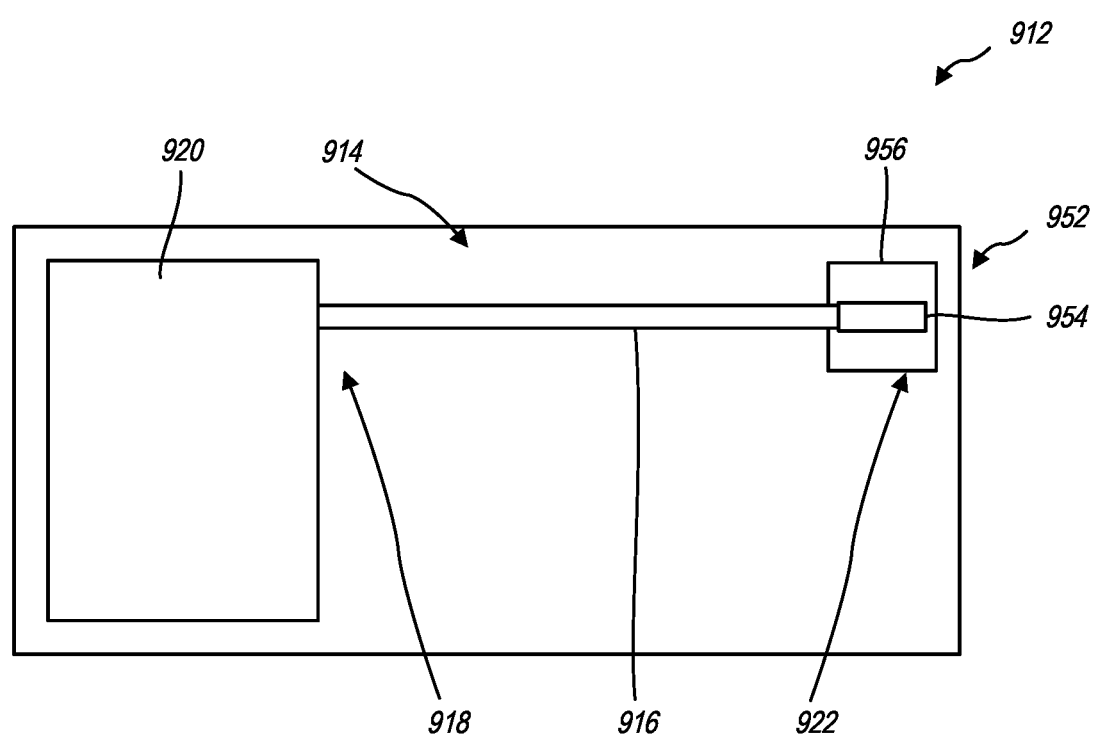
FIG. 9 is a side view of a downhole energy harvesting system, according to at least one embodiment of the present disclosure.

FIG. 9 is a representation of a downhole energy harvesting system 912, according to at least one embodiment of the present disclosure. The downhole energy harvesting system 912 shown includes an energy harvesting device 914 having a cantilevered body 916 connected to a clamp 920 at a first end 918 of the cantilevered body 916. The cantilevered body 916 is free or unbounded at a second end 922 of the cantilevered body 916. The energy harvesting device 914 may experience periodic oscillations and/or vibrations. This may cause the cantilevered body 916 to flex, thereby causing the piezoelectric strip to flex and generate an electric current.

The energy harvesting device 914 shown includes an electric generator 952. The electric generator 952 may include a magnet 954 located at the second end 922 of the cantilevered body 916. The magnet 954 may be located within an electric coil 956. During operation, the cantilevered body 916 may vibrate and/or oscillate. This may cause the magnet 954 to vibrate and/or oscillate within the electric coil 956. The changing magnetic field caused by the movement of the magnet 954 may cause an electric current in the electric coil 956. In this manner, the electric generator 952 may generate an electric current based on the vibration and/or oscillation of the cantilevered body 916.

In some embodiments, the electric generator 952 may be the only electricity generation mechanism. In some embodiments, the downhole energy harvesting system 912 may further include a piezoelectric strip connected to or located on the cantilevered body 916. Flexing of the cantilevered body 916 may cause the piezoelectric strip 924 to flex and generate an electric current. In this manner, motion from the cantilevered body 916 may generate more electricity than the electric generator 952 and/or the piezoelectric material alone.

Figure 10:
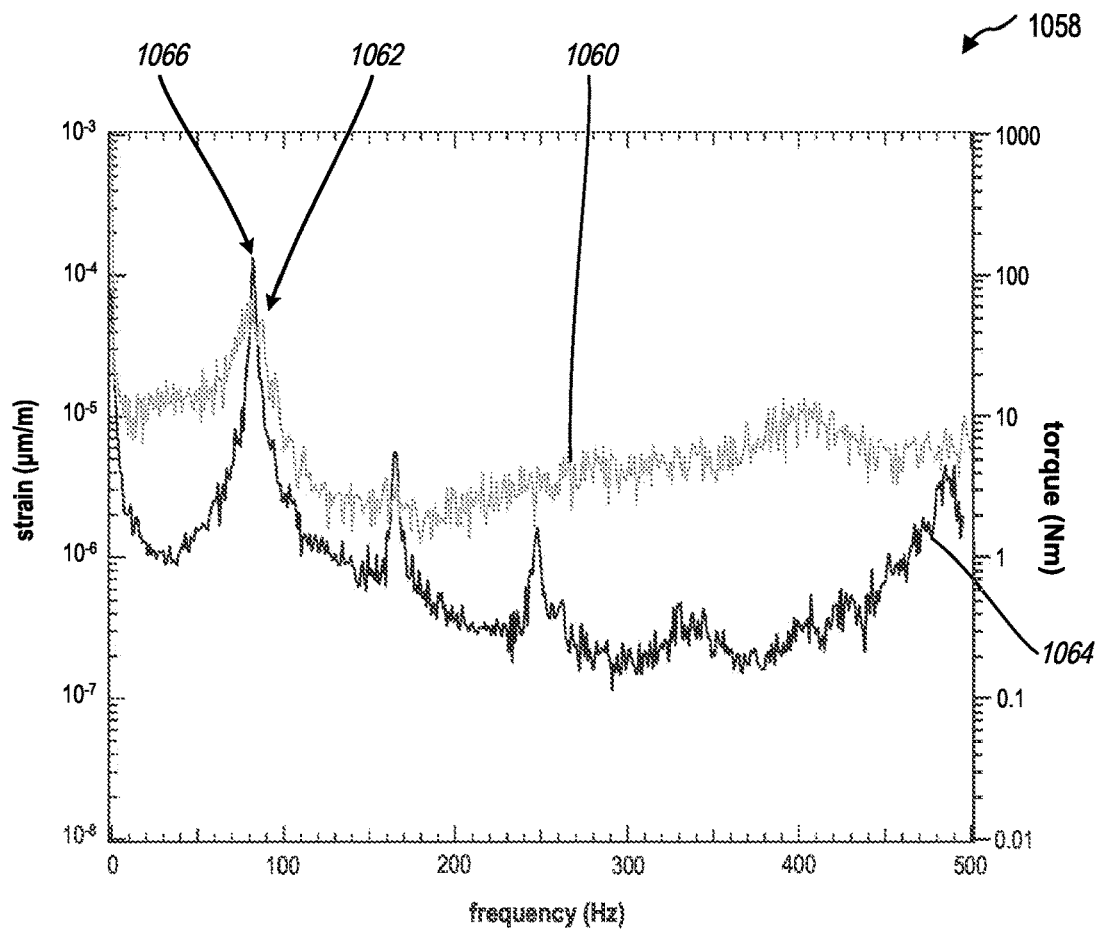
FIG. 10 is an oscillation plot showing frequency on the x-axis, strain on the left y-axis, and torque on the right y-axis, according to at least one embodiment of the present disclosure.

FIG. 10 is a representation of an oscillation plot 1058 showing frequency on the x-axis (e.g., horizontal axis), strain on the left-hand y-axis (e.g., vertical axis), and torque on the right-hand y-axis, according to at least one embodiment of the present disclosure. The oscillation plot 1058 shows experimental results of a cantilevered body (e.g., cantilevered body 216 of FIG. 2-1) subjected to periodic oscillations of a housing. The oscillation plot 1058 shows a torque plot 1060 illustrating torque of the housing with respect to frequency. The torque plot 1060 may be representative of the oscillations experienced by the housing. For example, the movement experienced by the housing during oscillations may be measured as torque on the housing. As may be seen, the torque plot 1060 shows a maximum torque 1062 at a frequency of approximately 80 Hz. The frequency at the maximum torque 1062 may be representative of the harmonic frequency of the downhole tool.

The oscillation plot 1058 further includes a vibration plot 1064 that illustrates strain with respect to frequency. Because piezoelectric material generates electricity based on the flexure of the cantilevered body, strain may be representative of the amount of electricity generated by the energy harvesting device. The cantilevered body may be tuned with a resonant frequency that is based on the harmonic frequency of the housing. In the experimental results shown, the cantilevered body is tuned with a resonant frequency of approximately 80 Hz.

The cantilevered body has a maximum strain 1066. As may be seen, the maximum strain 1066 is shown at approximately 80 Hz. The maximum strain 1066 coincides with the maximum torque 1062. This indicates that, by tuning the cantilevered body to the harmonic frequency of the housing, the energy harvesting device may be the most efficient and/or generate the most electricity.

As may be seen, the vibration plot 1064 may show other peaks or resonant frequencies. In some embodiments, the other peaks or resonant frequencies may coincide with other harmonic frequencies often experienced by the housing.

Figure 11:
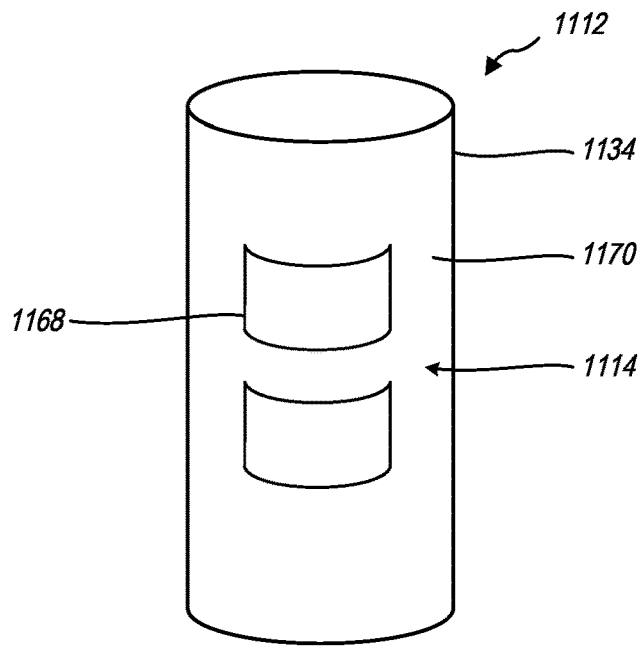
FIG. 11 is a representation of a downhole energy harvesting system, according to at least one embodiment of the present disclosure.

FIG. 11 is a representation of a downhole energy harvesting system 1112, according to at least one embodiment of the present disclosure. The downhole energy harvesting system 1112 shown includes an energy harvesting device 1114 connected to a housing 1134 of a downhole tool. In some embodiments, the energy harvesting device 1114 may include one or more piezoelectric components (e.g., piezoelectric patches 1168). The piezoelectric patches 1168 may include piezoelectric material. The piezoelectric patches 1168 may include a patch that conforms to a shape of the housing 1134. As the housing 1134 flexes, the piezoelectric patches 1168 may flex, causing the piezoelectric material to change shape and generate an electric current.

The piezoelectric patches 1168 may be directly connected to the body of the housing 1134. In this manner, the piezoelectric patches 1168 may directly generate electricity based on the periodic torque experienced by the housing 1134. This may help reduce losses between connecting elements of the energy harvesting device 1114.

The housing 1134 includes an outer surface 1170. In some embodiments, the piezoelectric patches 1168 may be adhered to (e.g., affixed by an adhesive) or otherwise connected to the outer surface 1170 of the housing 1134. In some embodiments, the piezoelectric patches 1168 may be located in a pocket recessed in the outer surface 1170 of the housing 1134. In some embodiments, the piezoelectric patches 1168 may be sized to cover any area of the outer surface 1170 of the housing 1134. In some embodiments, the piezoelectric patches 1168 may extend around an entirety of the circumference of the housing 1134. The size of the piezoelectric patches 1168 may determine the amount of electricity generated by the energy harvesting device 1114.

The piezoelectric patches 1168 may be located on the housing 1134 with the piezoelectric material oriented in any direction. For example, the piezoelectric material may be oriented at an approximately 45° angle. A 45° angle may be representative of the maximum strain experienced by the housing 1134. In some embodiments, the piezoelectric patches 1168 may include multiple orientations of the piezoelectric material. This may help to generate electricity based on multiple orientations of strain in the housing 1134.

Figure 12:
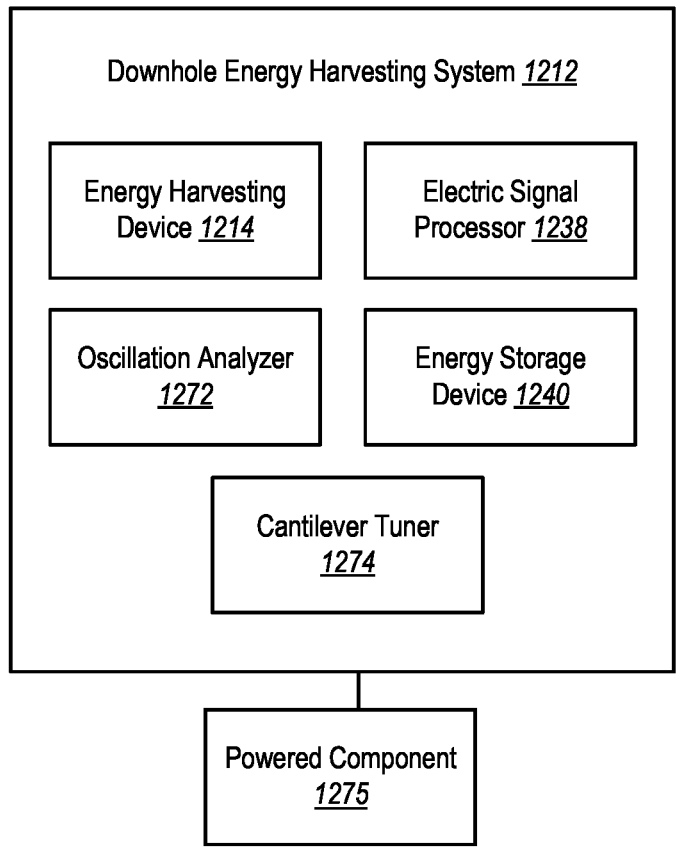
FIG. 12 is a schematic view of a downhole energy harvesting system, according to at least one embodiment of the present disclosure.

FIG. 12 is a schematic view of a downhole energy harvesting system 1212, according to at least one embodiment of the present disclosure. Each of the components of the downhole energy harvesting system 1212 can include software, hardware, or both. For example, the components can include one or more instructions stored on a computer-readable storage medium and executable by processors of one or more computing devices, such as a client device or server device. When executed by the one or more processors, the computer-executable instructions of the downhole energy harvesting system 1212 can cause the computing device(s) to perform the methods described herein. Alternatively, the components can include hardware, such as a special-purpose processing device to perform a certain function or group of functions. Alternatively, the components of the downhole energy harvesting system 1212 can include a combination of computer-executable instructions and hardware. As used herein, computer-readable media encompasses any combination of computer-readable storage media and computer-readable transmission media. Computer-readable storage media includes RAM, ROM, EEPROM, flash memory, optical disk storage, magnetic disk storage, and other types of physical storage media. In contrast, computer-readable transmission media includes wireless links, carrier waves, and other transmissions.

Furthermore, the components of the downhole energy harvesting system 1212 may, for example, be implemented as one or more operating systems, as one or more stand-alone applications, as one or more modules of an application, as one or more plug-ins, as one or more library functions or functions that may be called by other applications, and/or as a cloud-computing model. Thus, the components may be implemented as a stand-alone application, such as a desktop or mobile application. Furthermore, the components may be implemented as one or more web-based applications hosted on a remote server. The components may also be implemented in a suite of mobile device applications or "apps", which may include answer products.

The downhole energy harvesting system 1212 may include an energy harvesting device 1214. As discussed herein, the energy harvesting device 1214 may optionally be located in another tool or system, such as a downhole tool or BHA. The energy harvesting device 1214 may be configured to generate electricity based on periodic oscillations affecting the housing to which the energy harvesting device 1214 is connected. The downhole energy harvesting system 1212 may include an electric signal processor 1238. The electric signal processor 1238 may receive and process the power output or power generation from the energy harvesting device 1214. For example, the electric signal processor 1238 may include an AC to DC converter to convert the AC power generated by the energy harvesting device 1214 to DC power storable by an energy storage device 1240 or usable by one or more electric devices or systems such as the powered component 1275 coupled to the downhole energy harvesting system 1212.

In some embodiments, the downhole energy harvesting system 1212 may include an oscillation analyzer 1272. The oscillation analyzer 1272 may analyze the oscillation of the housing and/or the tool connected to the energy harvesting device 1214. For example, the oscillation analyzer 1272 may determine one or more harmonic frequencies experienced by the housing. The downhole energy harvesting system 1212 may include a cantilever tuner 1274. In some embodiments, the energy harvesting device 1214 may include a cantilevered mass. The cantilever tuner 1274 may adjust the position of a tuning mass. This may adjust the resonant frequency of the energy harvesting device 1214, thereby improving the electricity generation and/or efficiency of the energy harvesting device 1214.

Figure 13:
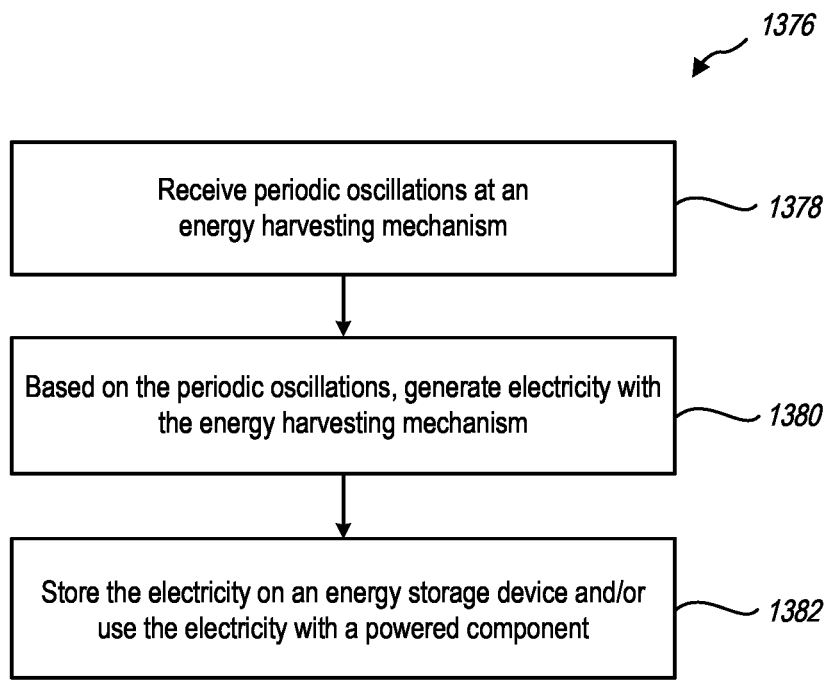
FIG. 13 is a flowchart of a method for downhole power generation, according to at least one embodiment of the present disclosure.

FIG. 13, the corresponding text, and the examples provide a number of different methods, systems, devices, and computer-readable storage media of the downhole energy harvesting system 1212. In addition to the foregoing, one or more embodiments can also be described in terms of flowcharts comprising acts for accomplishing a particular result, as shown in FIG. 13. FIG. 13 may be performed with more or fewer acts. Further, the acts may be performed in differing orders. Additionally, the acts described herein may be repeated or performed in parallel with one another or parallel with different instances of the same or similar acts.

As mentioned, FIG. 13 illustrates a flowchart of method 1376 of a series of acts for downhole energy generation in accordance with one or more embodiments. While FIG. 13 illustrates acts according to one embodiment, alternative embodiments may omit, add to, reorder, and/or modify any of the acts shown in FIG. 13. The acts of FIG. 13 can be performed as part of a method. Alternatively, computer-readable storage media can include instructions that, when executed by one or more processors, cause a computing device to perform the acts of FIG. 13. In some embodiments, a system can perform the acts of FIG. 13.

The downhole energy harvesting system may receive periodic oscillations at an energy harvesting device located at a rotating housing at 1378. The periodic oscillations may be received by an energy harvesting device. In some embodiments, receiving the periodic oscillations may include receiving torsional oscillations. The energy harvesting device may, based on the periodic oscillations, generate electricity with the energy harvesting device at 1380. In some embodiments, generating electricity may include generating electricity by vibrating the energy harvesting device. The energy harvesting device may include a cantilevered body. In some embodiments, the downhole energy harvesting system may store the electricity on an energy storage device located on or in the housing and/or use the harvested energy to power or operate a powered component at 1382.

In some embodiments, the downhole energy harvesting system may tune the cantilevered body to a harmonic frequency of the housing. In some embodiments, tuning the cantilevered body may include adjusting the position of a tuning mass connected to the free end of the cantilevered body. In some embodiments, tuning the cantilevered body may include tuning the cantilevered body while receiving the periodic oscillations.

The embodiments of the downhole energy harvesting system have been primarily described with reference to wellbore drilling operations; the downhole energy harvesting systems described herein may be used in applications other than the drilling of a wellbore. In other embodiments, downhole energy harvesting systems according to the present disclosure may be used outside a wellbore or other downhole environment used for the exploration or production of natural resources. For instance, downhole energy harvesting systems of the present disclosure may be used in a borehole used for placement of utility lines. Accordingly, the terms "wellbore," "borehole" and the like should not be interpreted to limit tools, systems, assemblies, or methods of the present disclosure to any particular industry, field, or environment.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. Similarly, references to orientations (e.g., "parallel", "perpendicular", etc.) are intended to include that orientation and other orientations that are "about" or "approximately" the stated orientation, as would be appreciated by one of ordinary skill in the art encompassed by embodiments of the present disclosure. A stated value or orientation should therefore be interpreted broadly enough to encompass values and orientations that are at least close enough to the stated value or orientation to perform a desired function or achieve a desired result. The stated values or orientation include at least the variation to be expected in a suitable manufacturing or production process, and may include values or orientations that are within 5%, within 1%, within 0.1%, or within 0.01% of a stated value or orientation.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that is within standard manufacturing or process tolerances, or which still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A downhole energy harvesting system for use in a wellbore, the downhole energy harvesting system comprising:
    a housing subjected to periodic oscillations when deployed in the wellbore, the housing having a pocket recessed in an outer surface or inner surface of the housing;
    an energy harvesting device disposed within the pocket and configured to generate electricity based on the periodic oscillations, wherein the energy harvesting device includes a clamp secured to the pocket, a cantilevered body with a first end connected to the clamp and a free second end spaced from the clamp and disposed opposite the first end, and piezoelectric material that extends along at least part of a length of the cantilevered body between the first end and the free second end, wherein the cantilevered body and the piezoelectric material are configured to flex to cause the piezoelectric material to generate electrical alternating current in response to the periodic oscillations, and wherein the free second end of the cantilevered body includes a tuning mass with a track configured to adjust position of the tuning mass at the free second end of the cantilevered body to change resonant frequency of the cantilevered body;
    an energy storage device connected to the energy harvesting device;
    at least one sensor configured to determine harmonic frequency of the housing when deployed in the wellbore and subjected to the periodic oscillations; and
    a controller configured to adjust position of the tuning mass at the free second end of the cantilevered body such that resonant frequency of the cantilevered body corresponds to the harmonic frequency of the housing when deployed in the wellbore and subjected to the periodic oscillations.

2. The downhole energy harvesting system of claim 1, wherein the cantilevered body is oriented parallel to a rotational axis of the housing.

3. The downhole energy harvesting system of claim 1, wherein the cantilevered body includes a vibrating plane that intersects a rotational axis of the housing.

4. The downhole energy harvesting system of claim 1, wherein the cantilevered body includes a vibrating plane that is parallel to a rotational axis of the housing.

5. A method for downhole energy generation in a wellbore, the method comprising:
    deploying the downhole energy harvesting system of claim 1 in the wellbore, which subjects the housing of the energy harvesting system to periodic oscillations;
    based on the periodic oscillations, generating electricity with the energy harvesting device of the downhole energy harvesting system with the at least one sensor and the controller of the downhole energy harvesting system cooperating to adjust position of the tuning mass along the track such that resonant frequency of the cantilevered body corresponds to the harmonic frequency of the housing; and
    at least one of (i) storing the electricity on the energy storage device of the downhole energy harvesting system or (ii) using the electricity to operate a powered component coupled to the housing of the downhole energy harvesting system.

6. The method of claim 5, wherein the periodic oscillations include torsional oscillations.

7. The downhole energy harvesting system of claim 1, further comprising:
    an electric signal processor coupled between the energy harvesting device and the energy storage device, wherein the electric signal processor is configured to convert electrical alternating current generated by the piezoelectric material of the energy harvesting device to electrical direct current for supply to the energy storage device.

8. The downhole energy harvesting system of claim 1, wherein:
    the piezoelectric material comprises a piezoelectric strip connected to the cantilevered body.

9. The downhole energy harvesting system of claim 8, wherein:
    the piezoelectric strip is located at a location of maximum strain on the cantilevered body.

10. The downhole energy harvesting system of claim 8, wherein:
    the piezoelectric strip is orientated to generate energy based on directional vibration of the cantilevered body.

11. The downhole energy harvesting system of claim 1, wherein:
    the cantilevered body has a variable thickness over the length of the cantilevered body.

12. The downhole energy harvesting system of claim 1, wherein:
    the cantilevered body has a three-dimensional shape selected from a group including rectangular prism, pyramidal, triangular prismatic, rectangular prismatic, pentagonal prismatic, hexagonal prismatic, prismatic of any shape, cymbals, rods, discs, and combinations thereof.

* * * * *